United States Patent
Thompson et al.

(10) Patent No.: US 11,268,989 B2
(45) Date of Patent: Mar. 8, 2022

(54) DUAL FEEDER SYSTEMS HAVING CURRENT TRANSFORMERS

(71) Applicant: Hamilton Sundstrand Corporation, Charlotte, NC (US)

(72) Inventors: Ernest Thompson, Janesville, WI (US); Dwight D. Schmitt, Rockford, IL (US); Jef William Good, German Valley, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 487 days.

(21) Appl. No.: 16/179,581

(22) Filed: Nov. 2, 2018

(65) Prior Publication Data

US 2020/0141982 A1   May 7, 2020

(51) Int. Cl.
| | | |
|---|---|---|
| G01R 15/18 | (2006.01) | |
| G01R 19/165 | (2006.01) | |
| G01R 31/08 | (2020.01) | |
| G06F 30/00 | (2020.01) | |
| H01F 30/12 | (2006.01) | |

(52) U.S. Cl.
CPC ..... *G01R 15/186* (2013.01); *G01R 19/16547* (2013.01); *G01R 31/086* (2013.01); *G06F 30/00* (2020.01); *H01F 30/12* (2013.01)

(58) Field of Classification Search
CPC .............. H02H 1/00; G01R 1/00; H01H 1/00
See application file for complete search history.

(56) References Cited

U.S. PATENT DOCUMENTS

| | | | |
|---|---|---|---|
| 3,458,810 A | * | 7/1969 | Herman ................. G01R 11/42 324/127 |
| 5,854,472 A | | 12/1998 | Wildi |
| 5,986,860 A | | 11/1999 | Scott |
| 6,782,329 B2 | | 8/2004 | Scott |
| 2006/0044710 A1 | | 3/2006 | Beneditz et al. |
| (Continued) | | | |

FOREIGN PATENT DOCUMENTS

CN   108572329 A   9/2018

OTHER PUBLICATIONS

Extended European search report issued in corresponding EP Application No. 19206985.4, dated Apr. 6, 2020.

*Primary Examiner* — Jermele M Hollington
*Assistant Examiner* — Temilade S Rhodes-Vivour
(74) *Attorney, Agent, or Firm* — Locke Lord LLP; Daniel J. Fiorello; Gabrielle L. Gelozin

(57) ABSTRACT

A dual feeder circuit system for supplying electrical power can include one or more feeder groups, each feeder having a first wire and a second wire connected between a source terminal and a load terminal to carry the same electrical signal on both wires. The system can include one or more current transformers disposed on one or more of the feeders groups such that the current transformer is disposed around both the first wire and the second wire. The first wire can be passed directly through a first side of the current transformer to allow current to travel through the current transformer in a first direction, and the second wire can include a loop and be passed through a second side of the current transformer to allow current to travel through the current transformer in an second direction opposite the first direction.

15 Claims, 2 Drawing Sheets

(56) References Cited

U.S. PATENT DOCUMENTS

| | | | | |
|---|---|---|---|---|
| 2011/0115449 A1* | 5/2011 | Schluter | ............... | H02M 1/36 |
| | | | | 323/238 |
| 2014/0226248 A1* | 8/2014 | Hameed | ............... | H02H 3/044 |
| | | | | 361/115 |
| 2015/0077133 A1* | 3/2015 | Fischer | ............... | G01R 31/085 |
| | | | | 324/537 |
| 2015/0171613 A1* | 6/2015 | Zhou | ............... | H02H 1/0015 |
| | | | | 361/2 |
| 2015/0346262 A1* | 12/2015 | Curtis | ............... | H02H 5/105 |
| | | | | 324/509 |
| 2018/0034258 A1* | 2/2018 | Schweitzer, III | ....... | H02H 3/20 |
| 2019/0195918 A1* | 6/2019 | Schweitzer, III | ...... | G01R 15/16 |

\* cited by examiner

DUAL FEEDER SYSTEMS HAVING CURRENT TRANSFORMERS

BACKGROUND

1. Field

The present disclosure relates to power supply systems, more specifically to duel feeder systems.

2. Description of Related Art

Existing dual feeder applications, e.g., for three phase power need six current transformers (CT), one for each electrical path, in order to measure three phase current sufficient to detect a fault or an opening of one of the two parallel feeder wires on a phase feed. There is a desire to reduce the size and/or weight of CTs in dual feeder applications.

Such conventional methods and systems have generally been considered satisfactory for their intended purpose. However, there is still a need in the art for improved dual feeder systems having current transformers. The present disclosure provides a solution for this need.

SUMMARY

In accordance with at least one aspect of this disclosure, a dual feeder circuit system for supplying electrical power can include one or more feeder groups, each feeder having a first wire and a second wire connected between a source terminal and a load terminal to carry the same electrical signal on both wires. The system can include one or more current transformers disposed on one or more of the feeders groups such that the current transformer is disposed around both the first wire and the second wire. The first wire can be passed directly through a first side of the current transformer to allow current to travel through the current transformer in a first direction, and the second wire can include a loop and be passed through a second side of the current transformer to allow current to travel through the current transformer in an second direction opposite the first direction.

The second wire can pass over the current transformer such that the loop is past the one or more current transformers in the direction of current. In certain embodiments, each current transformer can include an inner diameter equal to or greater than a width of the first wire plus the width of the second wire.

The one or more feeder groups can include three feeders groups configured to carry three phase current. Each feeder group can include at least one current transformer. In certain embodiments, each feeder group can include a single current transformer. The system can include the source terminal and the load terminal.

In accordance with at least one aspect of this disclosure, an aircraft electrical system can include any suitable embodiment of a dual feeder system as disclosed herein. Any other suitable components are contemplated herein.

In accordance with at least one aspect of this disclosure, a computerized method for determining a fault in a dual feeder circuit can include monitoring a current transformer disposed around a first wire and a second wire, each wire carrying a current in an opposite direction through the current transformer, and determining a fault exists if a signal above a threshold is received from the current transformer.

The method can include determining which of the first or second wire is faulted based on a direction of current received from the current transformer. The method can include determining a fault type based on a magnitude of current received from the current transformer. Any other suitable method steps are contemplated herein.

In accordance with at least one aspect of this disclosure, a non-transitory computer readable medium can include computer executable instructions configured to cause a computer to perform a method for determining a fault in a dual feeder circuit. The method can include any suitable embodiment of a method or portion thereof in accordance with this disclosure.

These and other features of the systems and methods of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
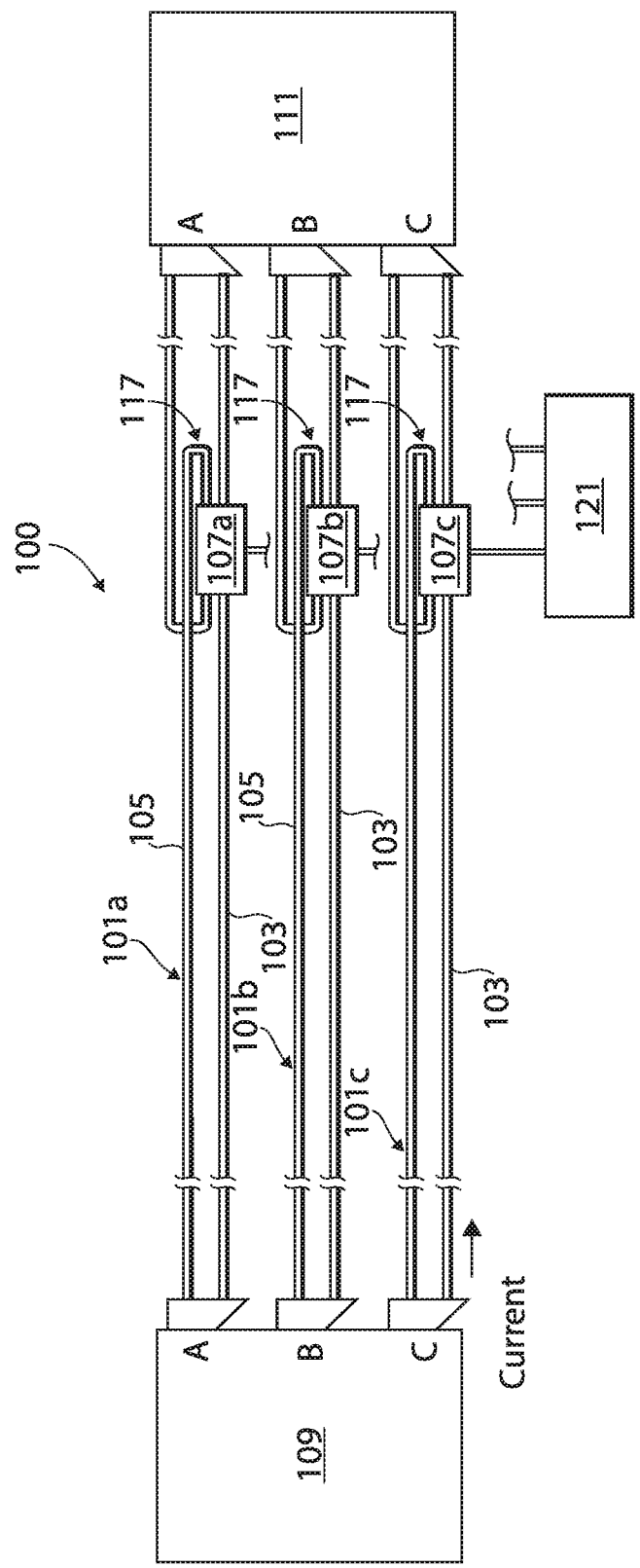
FIG. 1 is a schematic diagram of an embodiment of a system in accordance with this disclosure.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Certain other views, aspects, and/or embodiments are illustrated in FIG. 2.

Figure 2:
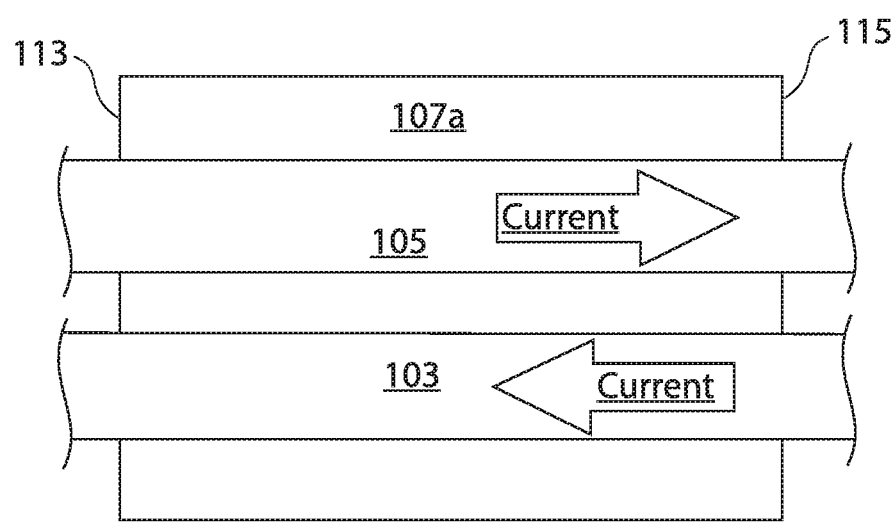
FIG. 2 is a schematic cross-sectional view of a portion of the embodiment of FIG. 1.

Referring to FIGS. 1 and 2, a dual feeder circuit system 100 for supplying electrical power can include one or more feeder groups 101a, 101b, 101c, each feeder group 101a, 101b, 101c having a first wire 103 and a second wire 105 connected between a source terminal 109 and a load terminal 111 to carry the same electrical signal on both wires 103, 105 of each feeder group 101a, 101b, 101c.

The system 100 can include one or more current transformers 107a, 107b, 107c disposed on one or more of the feeders groups 101a, 101b, 101c such that the current transformer is disposed around both the first wire 103 and the second wire 105 of at least one feeder group 101a, 101b, 101c. As shown, the first wire 103 can be passed directly through a first side 113 of the one or more current transformers 107a, 107b, 107c to allow current to travel through the respective current transformer 107a, 107b, 107c in a first direction, e.g., as shown in the FIG. 2 which illustrates wires within a current transformer, e.g., 107a. One having ordinary skill in the art in view of this disclosure appreciates that current can be alternating current or direct current, and the FIGS. 1 and 2 show only a single state of current flow for illustrative purposes only.

The second wire 105 can include a loop 117 and be passed through a second side 115 of one or more current transformers 107a, 107b, 107c to allow current to travel through a respective current transformer 107a, 107b, 107c in an second direction opposite the first direction, e.g., as shown in FIG. 2. As shown, the second wire 105 can pass over the current transformer 107a, 107b, 107c such that the loop 117 is past the one or more current transformers 107a, 107b, 107c in the direction of current to back feed the second wire 105. In certain embodiments, each current transformer 107a, 107b, 107c can include an inner diameter equal to or greater than a width of the first wire 103 plus a width of the second wire 105 (e.g., dual 2 or 4 gauge wires for example). Any other suitable size is contemplated herein.

The one or more feeder groups 101a, 101b, 101c can include three feeders groups 101a, 101b, 101c, e.g., as shown configured to carry three phase AC current. Each feeder group 101a, 101b, 101c can include at least one current transformer 107a, 107b, 107c. In certain embodiments, as shown, each feeder group 101a, 101b, 101c can include a single current transformer 107a, 107b, 107c (e.g., to reduce the total amount of current transformers and thus reducing size and weight of the system 100). Any suitable number of current transformers per group is contemplated herein (e.g., multiple per feeder group for redundancy).

As appreciated by those having ordinary skill in the art, the system 100 can include the source terminal and the load terminal, and/or any other suitable hardware and/or software components. In certain embodiments, the system 100 can include one or more computers 121 operatively connected to one or more (e.g., each) of the one or more current transformers 107a, 107b, 107c. The one or more computers 121 can be configured to receive current signals from the one or more current transformers 107a, 107b, 107c (e.g., to detect a fault, a type of fault, and/or which wire is faulted). The one or more computers 121 can be operatively connected to an AC electrical source to receive information regarding the state of the current flow into each group 101a, 101b, 101c so as to be able to compare the current direction from the current transformer to the current direction in the groups to determine which wire is faulted, for example. The one or more computers 121 can include any suitable hardware and/or software modules configured to allow the one or more computers 121 to perform any suitable method and/or portion thereof disclosed herein.

In accordance with at least one aspect of this disclosure, an aircraft electrical system can include any suitable embodiment of a dual feeder system 100 as disclosed herein. Any other suitable components are contemplated herein.

In accordance with at least one aspect of this disclosure, a computerized method (e.g., performed using one or more computers 121) for determining a fault in a dual feeder circuit can include monitoring a current transformer (e.g., 107a, 107b, 107c) disposed around a first wire 103 and a second wire 105, each wire carrying a current in an opposite direction through the current transformer. The method can include determining a fault exists if a signal above a threshold (e.g., a zero threshold, a non-zero threshold above a noise level) is received from the current transformer.

The method can include determining which of the first wire 103 or second wire 105 is faulted based on a direction of current received from the current transformer. The method can include determining a fault type based on a magnitude of current received from the current transformer. The method can include activating a protection (e.g., shutting off current to the feeders). Any other suitable methods and/or portions thereof are contemplated herein.

Embodiments back feed a second wire into a current transformer in a reverse direction which cancels current from a first wire in a current transformer. Certain embodiments allow for the use of a single current transformer for two wires. Certain embodiments allow use of a smaller current transformer due to normal current being cancelled to zero or about zero, whereas traditional current transformers must be larger to handle the double current experienced by the parallel wires with same current direction.

Embodiments can be used to determine which wire is faulted based on current direction. For example, a computer can receive information from the AC source to make such a determination. Embodiment can be used to detect any fault type (e.g., short-to-ground, open circuit, a generic short). Embodiments can also eliminate false, undesired nuisance faults, associated with prior art. Traditionally, the faults between source 109 and load 111 are detected by sensing the difference in signals between two current sensors, one located in source and one at the load. Nuisance trips can occur due to variations in the sensing accuracy between the two current sensors e.g., where current difference is just large enough to trip the protection circuit even there is no fault. The nuisance trip in traditional systems can be eliminated by increasing the threshold for fault declaration. Certain embodiments are therefore more reliable than traditional technology as well as smaller and lighter.

In certain embodiments current transformer size can be reduced by passing two wires through the current transformer in opposite directions to cancel the flux. This also reduces the number (e.g., by half) of current transformers in a given system (e.g., from six to three for a three phase AC current dual feeder system). Protection is maintained because a drop of current in one or the other wire will result in large change in flux that is detectable, and a direction of flux change can be used to determine which current fault occurred.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

Any suitable combination(s) of any disclosed embodiments and/or any suitable portion(s) thereof are contemplated herein as appreciated by those having ordinary skill in the art.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A dual feeder circuit system for supplying electrical power, comprising:
   one or more feeders groups, each feeder group having a first wire and a second wire connected between a source terminal and a load terminal to carry the same electrical signal on both wires; and
   one or more current transformers disposed on one or more of the feeders groups such that the current transformer is disposed around both the first wire and the second wire, wherein the first wire is passed directly through a first side of the current transformer to allow current to travel through the current transformer in a first direction, and wherein the second wire includes a loop and is passed through a second side of the current transformer to allow current to travel through the current transformer in an second direction opposite the first direction, wherein the second wire passes over the current transformer, wherein the loop is past the one or more current transformers in the direction of current.

2. The dual feeder system of claim 1, wherein each current transformer includes an inner diameter equal to or greater than a width of the first wire plus the width of the second wire.

3. The dual feeder system of claim 1, wherein the one or more of feeder groups includes three feeders groups configured to carry three phase current.

4. The dual feeder system of claim 3, wherein each feeder group includes at least one current transformer.

5. The dual feeder system of claim 4, wherein each feeder group includes a single current transformer.

6. The dual feeder system of claim 1, further comprising the source terminal and the load terminal.

7. An aircraft electrical system, comprising:
   a dual feeder system for supplying electrical power, comprising:
     one or more feeders groups, each feeder group having a first wire and a second wire connected between a source terminal and a load terminal to carry the same electrical signal on both wires; and
     one or more current transformers disposed on one or more of the feeders groups such that the current transformer is disposed around both the first wire and the second wire, wherein the first wire is passed directly through a first side of the current transformer to allow current to travel through the current transformer in a first direction, and wherein the second wire includes a loop and is passed through a second side of the current transformer to allow current to travel through the current transformer in an second direction opposite the first direction, wherein the second wire passes over the current transformer, wherein the loop is past the one or more current transformers in the direction of current.

8. The system of claim 7, wherein each current transformer includes an inner diameter equal to or greater than a width of the first wire plus the width of the second wire.

9. The system of claim 7, wherein the one or more feeder groups includes three feeders groups configured to carry three phase current.

10. The system of claim 9, wherein each feeder group includes at least one current transformer.

11. The system of claim 10, wherein each feeder group includes a single current transformer.

12. The system of claim 7, further comprising the source terminal and the load terminal.

13. A computerized method for determining a fault in a dual feeder circuit, comprising:

monitoring a current transformer disposed around a first wire and a second wire, wherein the first wire is passed directly through a first side of the current transformer to allow current to travel through the current transformer in a first direction, and wherein the second wire includes a loop and is passed through a second side of the current transformer to allow current to travel through the current transformer in an second direction, opposite the first direction, wherein the second wire passes over the current transformer, wherein the loop is past the one or more current transformers in the direction of current; and determining a fault exists if a signal above a threshold is received from the current transformer.

14. The method of claim 13, further comprising determining which of the first or second wire is faulted based on a direction of current received from the current transformer.

15. The method of claim 13, further comprising determining a fault type based on a magnitude of current received from the current transformer.

* * * * *